(12) United States Patent
Markle et al.

(10) Patent No.: US 10,162,268 B2
(45) Date of Patent: Dec. 25, 2018

(54) TWISTED KALEIDO

(71) Applicant: Applied Materials, Inc., Santa Clara, CA (US)

(72) Inventors: David Markle, Pleasanton, CA (US); Timothy N. Thomas, Portland, OR (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/656,054

(22) Filed: Jul. 21, 2017

(65) Prior Publication Data

US 2018/0024441 A1 Jan. 25, 2018

Related U.S. Application Data

(60) Provisional application No. 62/365,879, filed on Jul. 22, 2016.

(51) Int. Cl.
*G03F 7/20* (2006.01)
*F21V 8/00* (2006.01)
(Continued)

(52) U.S. Cl.
CPC ....... *G03F 7/70191* (2013.01); *G02B 6/0005* (2013.01); *G02B 6/04* (2013.01);
(Continued)

(58) Field of Classification Search
CPC .... G02B 6/00005; G02B 6/0096; G02B 6/04; G02B 6/102; G02B 13/0095; G02B 13/16;
(Continued)

(56) References Cited

U.S. PATENT DOCUMENTS

| 3,752,561 A | 8/1973 | Klemt |
| 2005/0206866 A1* | 9/2005 | Ozaki ................ G03F 7/70283 355/53 |

(Continued)

FOREIGN PATENT DOCUMENTS

WO 97-43770 A1 11/1997

OTHER PUBLICATIONS

International Search Report and Written Opinion for International Application No. PCT/US2017/042731 dated Nov. 1, 2017.

*Primary Examiner* — Colin Kreutzer
(74) *Attorney, Agent, or Firm* — Patterson + Sheridan LLP

(57) ABSTRACT

Implementations disclosed herein generally relate to a light pipe, or kaleido, for homogenizing light such that the light is uniform once the light exits the light pipe. By reflecting the light inside the light pipe, light uniformity is increased. In one implementation, a light pipe for an image projection apparatus is provided. The light pipe comprises an elongated rectangular body having a refractive index that provides total internal reflection within the elongated rectangular body. The elongated rectangular body has an input face for accepting light into the elongated rectangular body. The input face disposed substantially orthogonal to a longitudinal axis of the elongated rectangular body. The elongated rectangular body has an output face for releasing light from the elongated rectangular body. The output face is disposed substantially orthogonal to the longitudinal axis. The elongated rectangular body has a twist along the longitudinal axis.

20 Claims, 3 Drawing Sheets

(51) Int. Cl.
*G02B 6/04* (2006.01)
*G02B 6/10* (2006.01)
*G03B 21/20* (2006.01)
*G03B 21/00* (2006.01)

(52) U.S. Cl.
CPC ........... *G02B 6/102* (2013.01); *G03B 21/208* (2013.01); *G03F 7/70075* (2013.01); *G03B 21/008* (2013.01)

(58) Field of Classification Search
CPC ............. G02B 27/0994; G03F 7/70075; G03F 7/7015; G03F 7/70191
USPC .............................. 355/67, 71; 385/133, 146
See application file for complete search history.

(56) References Cited

U.S. PATENT DOCUMENTS

| | | | |
|---|---|---|---|
| 2006/0132734 A1* | 6/2006 | Luttikhuis | G03F 7/70616 355/53 |
| 2008/0013911 A1 | 1/2008 | Jennings | |
| 2009/0141251 A1 | 6/2009 | Kim et al. | |
| 2015/0277035 A1 | 10/2015 | Bryan et al. | |
| 2015/0362660 A1* | 12/2015 | Wald | G02B 27/0994 250/227.11 |
| 2016/0124316 A1 | 5/2016 | Markle et al. | |

* cited by examiner

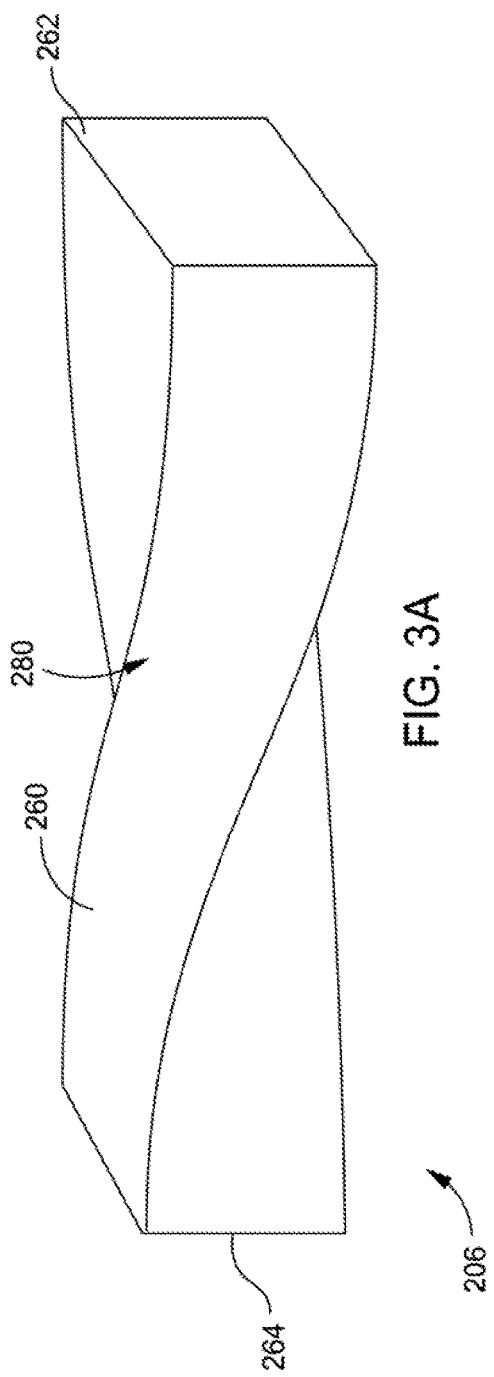
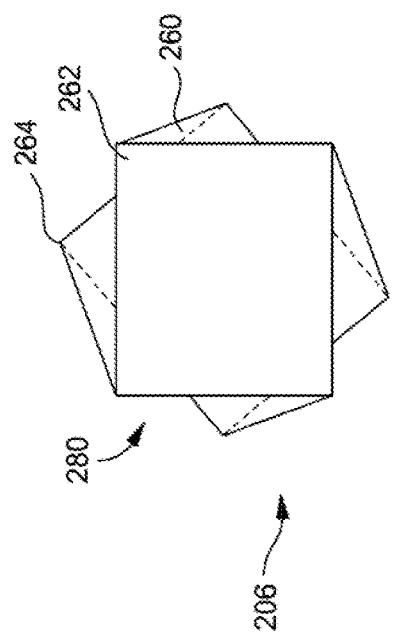
FIG. 3A
FIG. 3B

TWISTED KALEIDO

CROSS-REFERENCE TO RELATED APPLICATIONS

This application claims benefit of U.S. Provisional Patent Application Ser. No. 62/365,879, filed Jul. 22, 2016, which is incorporated herein by reference in its entirety.

BACKGROUND

Field

Implementations of the present disclosure generally relate to the field of lithography wherein a laser is employed as the illumination source. More specifically, implementations provided herein relate to a system and apparatus for illuminating a pattern to be imaged in a lithography system.

Description of the Related Art

Photolithography is widely used in the manufacturing of display devices, such as liquid crystal displays (LCDs). Large area substrates are often utilized in the manufacture of LCDs. LCDs, or flat panels, are commonly used for active matrix displays, such as computers, touch panel devices, personal digital assistants (PDAs), cell phones, television monitors, and the like. Generally, flat panels may include a layer of liquid crystal material forming pixels sandwiched between two plates. When power from the power supply is applied across the liquid crystal material, an amount of light passing through the liquid crystal material may be controlled at pixel locations enabling images to be generated.

Microlithography techniques are generally employed to create electrical features incorporated as part of the liquid crystal material layer forming the pixels. According to this technique, a light-sensitive photoresist is typically applied to at least one surface of the substrate. Then, an illuminated pattern is imaged onto the light-sensitive photoresist to cause chemical changes to the photoresist in the selective areas to prepare these selective areas for subsequent material removal and/or material retention processes to create a pattern in the resist that will subsequently be used to define the electrical features.

In order to continue to provide display devices and other devices to consumers at the prices demanded by consumers, new apparatuses, approaches, and systems are needed to precisely and cost-effectively create patterns on substrates, such as large area substrates.

SUMMARY

Implementations disclosed herein generally relate to a light pipe, or kaleido, for homogenizing light such that the light is uniform once the light exits the light pipe. By reflecting the light inside the light pipe, light uniformity is increased. In one implementation, a light pipe for an image projection apparatus is provided. The light pipe comprises an elongated rectangular body having a refractive index that provides total internal reflection within the elongated rectangular body. The elongated rectangular body has an input face for accepting light into the elongated rectangular body. The input face disposed substantially orthogonal to a longitudinal axis of the elongated rectangular body. The elongated rectangular body has an output face for releasing light from the elongated rectangular body. The output face is disposed substantially orthogonal to the longitudinal axis. The elongated rectangular body has a twist along the longitudinal axis.

In another implementation, an image projection apparatus for imaging patterns on a substrate is provided. The image projection apparatus comprises an illumination system comprising. The illumination system comprises a light pipe having an elongated rectangular body. The elongated rectangular body has an input face for accepting light into the elongated rectangular body, the input face disposed substantially orthogonal to a longitudinal axis of the elongated rectangular body. The elongated rectangular body has an output face for releasing light from the elongated rectangular body, the output face disposed substantially orthogonal to the longitudinal axis. The elongated rectangular body has a twist along the longitudinal axis so that the input face and the output face are twisted relative to each other. The illumination system further comprises a laser light illumination device disposed adjacent to the input face of the light pipe. The image projection apparatus further comprises a projection system. The projection system comprises at least one projection lens and a light source coupled with the light pipe.

In yet another implementation, a system is provided. The system comprises two or more stages, wherein each stage is configured to hold one or more substrates. The system further comprises a plurality of image projection apparatuses for patterning the one or more substrates. Each image projection apparatus comprises an illumination system. The illumination system comprises a light pipe having an elongated rectangular body. The elongated rectangular body has an input face for accepting light into the elongated rectangular body, the input face disposed substantially orthogonal to a longitudinal axis of the elongated rectangular body. The elongated rectangular body has an output face for releasing light from the elongated rectangular body, the output face disposed substantially orthogonal to the longitudinal axis. The elongated rectangular body has a twist along the longitudinal axis so that the input face and the output face are twisted relative to each other. Each image projection apparatus further comprises a laser light source coupled with the light pipe.

In yet another implementation, a method of shaping a beam of illumination is provided. The method comprises directing light into a light pipe at an input face of the light pipe, wherein the light pipe has an elongated rectangular body and the input face is disposed substantially orthogonal to a longitudinal axis of the elongated rectangular body. The method further comprises propagating the directed light by total internal reflection through the light pipe to an output face of the light pipe, the output face disposed substantially orthogonal to the longitudinal axis. The method further comprises allowing the propagated light to emanate from the output face, wherein the elongated rectangular body has a twist along the longitudinal axis.

In yet another implementation, a method of processing a substrate is provided. The method comprises directing light into a light pipe at an input face of the light pipe, wherein the light pipe has an elongated rectangular body and the input face is disposed substantially orthogonal to a longitudinal axis of the elongated rectangular body. The elongated rectangular body has a twist along the longitudinal axis. The method further comprises propagating the directed light by total internal reflection through the light pipe to an output face of the light pipe, wherein the output face is disposed substantially orthogonal to the longitudinal axis. The method further comprises allowing the propagated light to emanate from the output face as an elongated beam. The method further comprises illuminating a pattern to be imaged across a surface of a substrate, wherein the surface of the substrate has a light-sensitive photoresist disposed thereon.

BRIEF DESCRIPTION OF THE DRAWINGS

So that the manner in which the above-recited features of the present disclosure can be understood in detail, a more particular description of the disclosure, briefly summarized above, may be had by reference to implementations, some of which are illustrated in the appended drawings. It is to be noted, however, that the appended drawings illustrate only exemplary implementations of this disclosure and are therefore not to be considered limiting of its scope, for the disclosure may be applied to other equally effective implementations.

FIG. 3A is a schematic perspective view of a light pipe, according to one or more implementations of the present disclosure.

FIG. 3B is a schematic end view of the light pipe of FIG. 3A, according to one or more implementations of the present disclosure.

Figure 1:
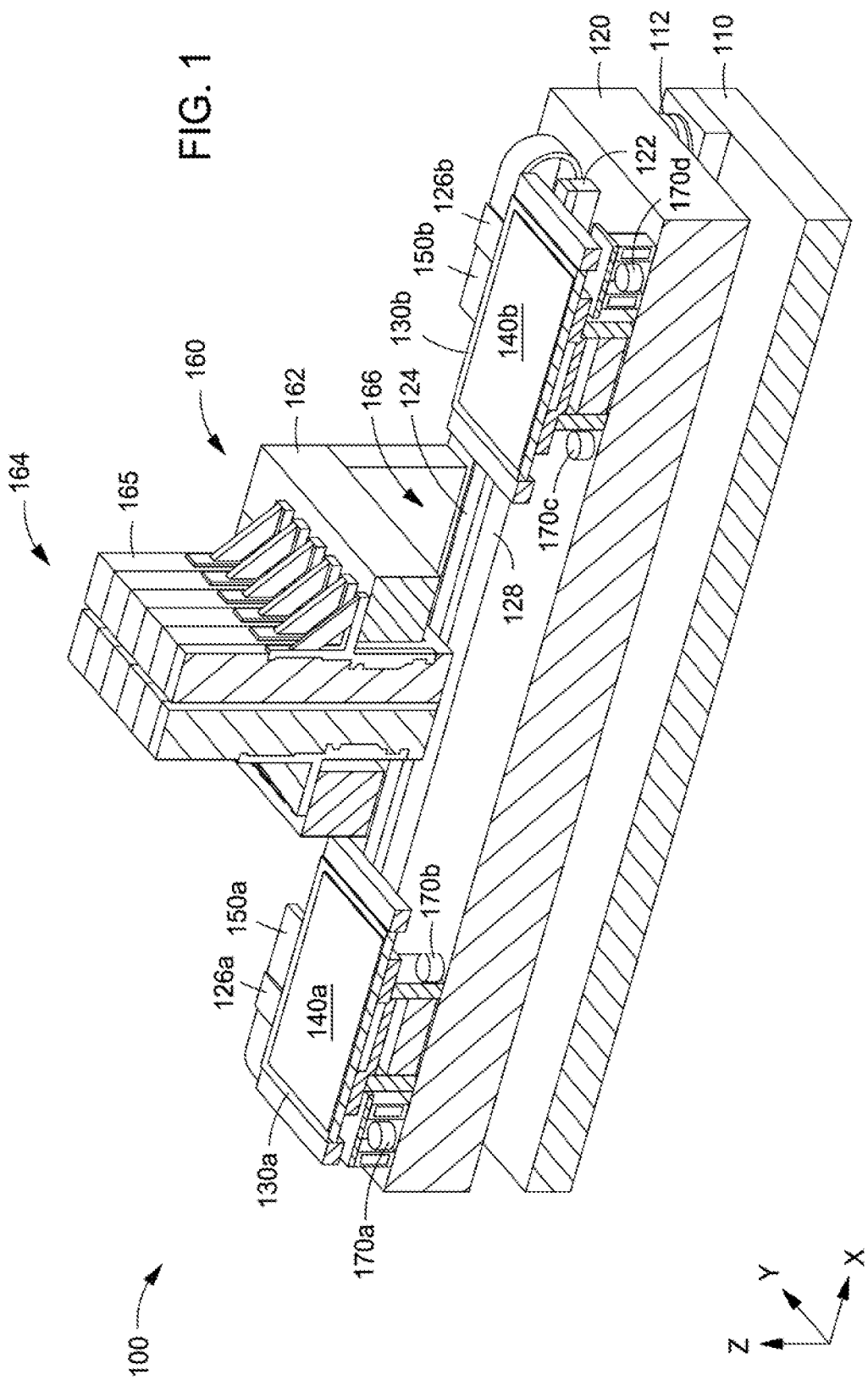
FIG. 1 is a perspective view of a system that may benefit from implementations disclosed herein.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

The following disclosure describes a light pipe, or kaleido, for homogenizing light such that the light is uniform once the light exits the light pipe. Certain details are set forth in the following description and in FIGS. 1, 2, 3A and 3B to provide a thorough understanding of various implementations of the disclosure. Other details describing well-known structures and systems often associated with light pipes and lithography are not set forth in the following disclosure to avoid unnecessarily obscuring the description of the various implementations.

Many of the details, dimensions, angles, and other features shown in the Figures are merely illustrative of particular implementations. Accordingly, other implementations can have other details, components, dimensions, angles, and features without departing from the spirit or scope of the present disclosure. In addition, further implementations of the disclosure can be practiced without several of the details described below.

The term "light pipe" as used herein includes, for example, a "kaleido," and vice versa. A light pipe is a physical structure used for transporting and/or altering the distribution of light generated from one or more laser sources.

Implementations disclosed herein generally relate to a light pipe, or kaleido, for homogenizing light such that the light is uniform once the light exits the light pipe. By reflecting the light inside the light pipe, light uniformity is improved. In one implementation, a light pipe for an image projection apparatus is disclosed. The light pipe includes a relatively long body having an input face and an output face. The light pipe is typically illuminated with multiple laser diode sources. The light pipe is twisted between the input face and output face. A non-uniform distribution of light is introduced at the input face, which travels the length of the light pipe, and emerges from the output face in a more uniform distribution. During its travel along the length of the pipe, a typical light ray is reflected multiple times and the many possible paths serve to homogenize the light distribution at the output face. Light is unable to escape from the smooth sides of the light pipe because the reflection angles result in total internal reflection.

FIG. 1 is a perspective view of a system 100 that may benefit from implementations disclosed herein. The system 100, shown in cross-section, includes a base frame 110, a slab 120, two or more stages 130a, 130b (collectively 130), and a processing apparatus 160. Although two stages 130a, 130b are shown, it should be understood that in some implementations, one stage 130 may be used. The base frame 110 may rest on the floor of a fabrication facility and may support the slab 120. Passive air isolators 112 may be positioned between the base frame 110 and the slab 120. The slab 120 may be a monolithic piece of granite, and the two or more stages 130 may be disposed on the slab 120. A substrate 140a, 140b (collectively 140) may be supported by each of the two or more stages 130. A plurality of holes (not shown) may be formed in the stage 130 for allowing a plurality of lift pins (not shown) to extend therethrough. The lift pins may rise to an extended position to receive the substrate 140, such as from a transfer robot (not shown). The transfer robot may position the substrate 140 on the lift pins, and the lift pins may thereafter gently lower the substrate 140 onto the stage 130.

The substrate 140 may, for example, be made of glass and be used as part of a flat panel display. In other implementations, the substrate 140 may be made of other suitable materials. In some implementations, the substrate 140 may have a photoresist layer formed thereon. A photoresist is sensitive to radiation and may be a positive photoresist or a negative photoresist, meaning that portions of the photoresist exposed to radiation will be respectively soluble or insoluble to a photoresist developer applied to the photoresist after the pattern is exposed into the photoresist. The chemical composition of the photoresist determines whether the photoresist will be a positive photoresist or negative photoresist. For example, the photoresist may include at least one of diazonaphthoquinone (DNQ), a phenol formaldehyde resin, poly(methyl methacrylate), poly(methyl glutarimide), and SU-8. In this manner, the pattern may be created in a resist layer on a surface of the substrate 140, and this pattern is employed to define the shape of layers below the resist layer that ultimately compose the electronic circuitry.

The system 100 may further include a pair of supports 122 and a pair of tracks 124. The pair of supports 122 may be disposed on the slab 120, and may be a single piece of material. The pair of tracks 124 may be supported by the pair of supports 122, and the two or more stages 130 may move along the tracks 124 in the X-direction. In one implementation, the pair of tracks 124 is collinear with a pair of parallel magnetic channels (not shown). As shown, each track 124 of the pair of tracks 124 is linear. An encoder 126a, 126b (collectively 126) may be coupled with each stage 130 in order to provide location information to a controller (not shown).

The processing apparatus 160 may include a support 162 and a processing unit 164. The support 162 may be disposed on the slab 120 and may include an opening 166 for the two or more stages 130 to pass under the processing unit 164. The processing unit 164 may be supported by the support 162. In one implementation, the processing unit 164 is a pattern generator configured to expose a photoresist in a photolithography process. In some implementations, the pattern generator may be configured to perform a maskless lithography process. The processing unit 164 may include a plurality of image projection apparatuses (shown in FIG. 2) disposed in a case 165. The processing apparatus 160 may be utilized to perform maskless direct patterning. During operation, one of the stages 130 moves in the X-direction from a loading position, as shown in FIG. 1, to a processing position. The processing position may refer to one or more positions of the stage 130 as the stage 130 passes under the processing unit 164. During operation, the stages 130 may be supported by a plurality of air bearings 170a-d (collectively 170) and may move along the pair of tracks 124 from the loading position to the processing position. A plurality of guide air bearings (not shown) may be coupled with each stage 130 and positioned adjacent an inner wall 128 of each support 122 in order to stabilize the movement of the stage 130 in the Y-direction. Each of the two or more stages 130 may also move in the Y-direction by moving along a track 150a, 150b (collectively 150) for processing and/or indexing the substrate 140.

As shown, each stage 130 includes the plurality of air bearings 170 for supporting the stage 130. Each stage 130 may also include a motor coil (not shown) for moving the stage 130 along the tracks 124. The two or more stages 130 and the processing apparatus 160 may be enclosed by an enclosure (not shown) in order to provide temperature and pressure control.

Figure 2:
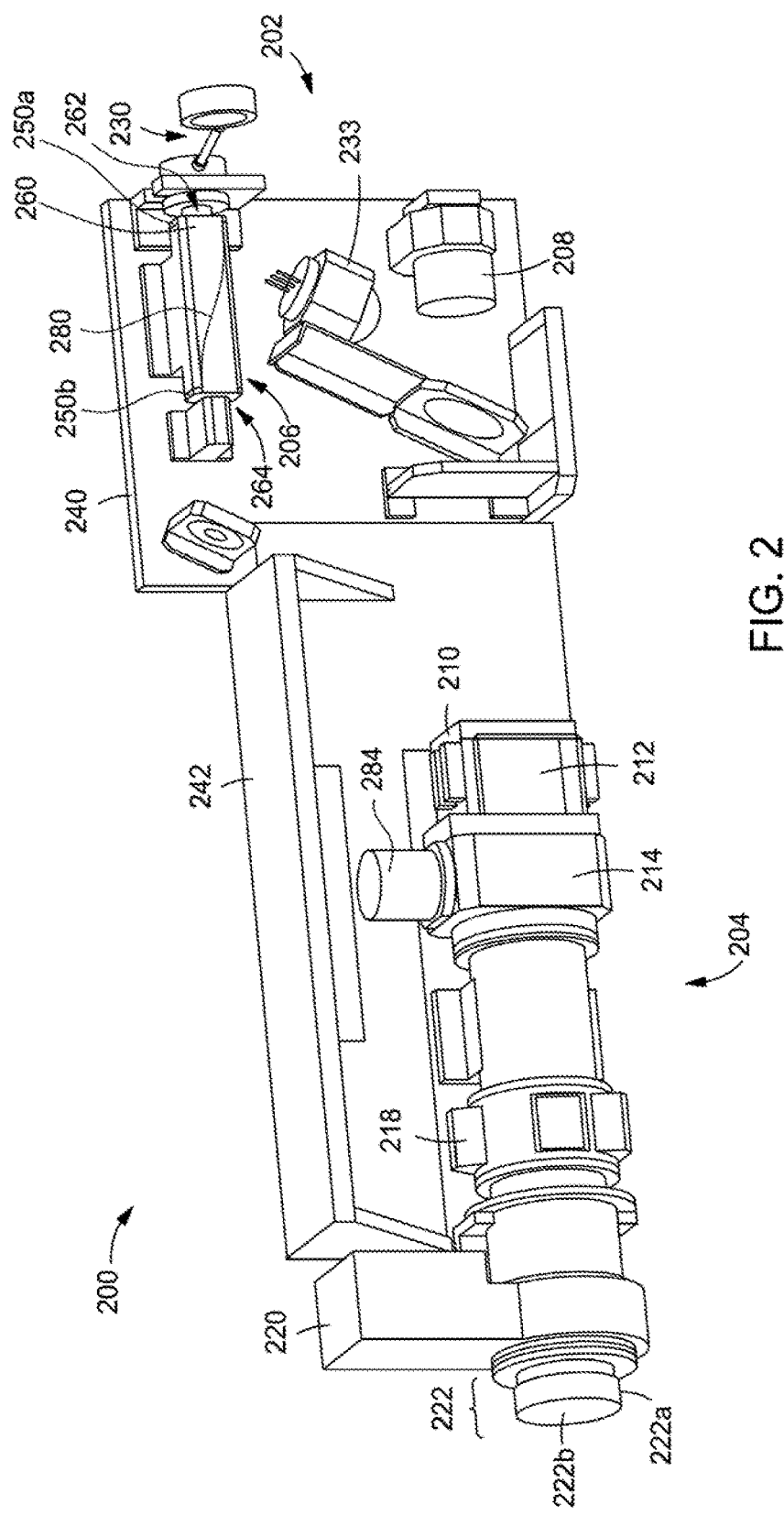
FIG. 2 is a perspective view of an image projection and illumination apparatus, according to one or more implementations of the present disclosure.

FIG. 2 is a perspective view of an image projection apparatus 200 according to one implementation. The image projection apparatus 200 is used to project an illuminated pattern on a substrate 140 (shown in FIG. 1). Furthermore, the image projection apparatus 200 patterns the one or more substrates, as discussed above.

The image projection apparatus 200 is disposed within the processing unit 164, shown in FIG. 1. The image projection apparatus 200 includes two subsystems—an illumination system 202 and a projection system 204. The illumination system 202 includes at least a light pipe 206 and, in some implementations, also includes a white light illumination device 208. Furthermore, as shown in FIG. 2, the light pipe 206 may be fixed by, clamped with, mounted to and/or coupled with locking devices 250a, 250b (collectively 250) at both an input face 262 or input end and an output face 264 or output end of the light pipe 206. The locking device 250 ensures that the light pipe 206 remains in a twisted condition. The locking device(s) 250 shown are only exemplary and any type and/or number of locking device(s) 250 sufficient to maintain the light pipe 206 in a twisted condition may be used.

With reference to FIG. 2, FIG. 3A and FIG. 3B, the light pipe 206 includes a body 260 having the input face 262 and the output face 264. In certain implementations, the body 260 may be fabricated to have a rectangular shape, a hexagonal shape, or any other suitable shape prior to twisting. The light pipe 206 is then mounted in the processing unit 164 in such a way that one end (e.g., the input face 262) is twisted with respect to the other end (e.g., the output face 264) and the sides of the body 260 are no longer flat but contain a twist 280.

The projection system 204 projects patterned exposure beams to the surface of the substrate 140. The projection system 204 includes a projection lens 222. The projection lens 222 includes a focus group 222a and a window 222b. In some implementations, the projection lens 222 may be a 10X objective lens, or any other suitable lens. In some implementations, the projection system 204 may also include at least one digital micromirror device ("DMD") 210, a frustrated prism assembly 212, a beam splitter 214, a distortion compensator 218, and/or a focus motor 220, as shown in FIG. 2.

Light is introduced to the image projection apparatus 200 from a light source 230. In some implementations, the light source 230 is coupled with the light pipe 206. The light source 230 may be an actinic light source. For example, the light source 230 may be a bundle of one or more fiber optics. Each fiber optic may contain the output from one laser. In one implementation, the light source 230 is a bundle of two or more fibers. In one implementation, the light source 230 may be a bundle of about 100 fibers. The bundle of fibers may be illuminated by a white light illumination device 208 (e.g., laser diode(s) combined with fluorescent materials). The light source 230 is coupled with the light pipe 206. In one implementation, the light source 230 is coupled with the light pipe 206 through a combiner, which packs each of the fibers into a compact bundle.

Once light from the light source 230 enters into the light pipe 206 via the input face 262, the light is reflected off of the walls inside the light pipe 206 such that the light is homogenized and uniform when it exits the light pipe 206 via the output face 264. Some of the light may reflect in the light pipe 206 up to ten times. In other words, the light goes through multiple internal reflections within the light pipe 206. For example, laser diodes typically have a finite number of nodes, which result in an output spectrum that contains a finite number of discrete wavelengths. In a typical case there could be 10 different wavelengths each having different amplitude. A group of 20 independent laser diodes might produce 200 different wavelengths. The resulting non-uniformity from passing these wavelengths through an untwisted light pipe would be roughly inversely proportional to the square root of the number of nodes. In this example the non-uniformity would be about $1/(200^{\wedge}0.5)=0.07$. Experiments have shown that putting a twist in the light pipe substantially improves the resulting uniformity at the output face.

The image projection apparatus 200 may optionally include partially reflective surfaces (not labeled). These surfaces direct some of the light traveling through the image projection apparatus 200 to a light level sensor 233 so that the laser output level may be monitored and the exposure dose kept constant.

The white light illumination device 208 projects broadband visible light into the projection system of image projection apparatus 200. This broadband visible light can be used to align the pattern on the DMD 210 with the patterns on the substrate 140. Specifically, the white light illumination device 208 directs the light to the frustrated prism assembly 212. The actinic and broadband light sources may be turned on and off independently of one another.

The frustrated prism assembly 212 functions to efficiently couple the light from the light pipe 206 that illuminates the DMD 210 and efficiently couples the patterned light from the DMD 210 that will be projected onto the surface of the substrate 140. The DMD 210 separates the incident light into light that will be projected onto the substrate 140 and light that is not projected onto the substrate 140. Use of the frustrated prism assembly 212 results in minimum energy loss. A beam splitter 214 images light reflected from the patterned substrate onto a camera, which can be used to align the projected pattern with the pattern on the substrate.

The DMD 210 is included as part of the frustrated prism assembly 212. The DMD 210 is the image transducer of the image projection apparatus 200. Use of the DMD 210 and frustrated prism assembly 212 help to minimize the footprint of each image projection apparatus 200 by keeping the direction of the flow of illumination roughly normal to the substrate 140 all the way from the light source 230 that generates the exposure illumination to the substrate focal plane.

The beam splitter 214 is used to extract light returning from the substrate for alignment and for sensing the focus position of the substrate. More specifically, the beam splitter 214 is used to split the light into two or more separate beams. In one embodiment, a focus sensor and an alignment camera 284 are attached to the beam splitter 214. The focus sensor and alignment camera 284 may each be configured to monitor various aspects of the imaging quality of the image projection apparatus 200. Additionally, the alignment camera 284 may be used to examine the image, which is projected onto the substrate 140. In further implementations, the alignment camera 284 may be used to capture images on the substrate 140 at various focus positions and make a comparison between those images. In other words, the focus sensor and camera 284 may be used to perform inspection functions.

Together the projection optics of the projection system 204, including its components, the distortion compensator 218, the focus motor 220, prepare for and ultimately project the image from the DMD 210 onto the substrate 140. The projection lens 222 includes a focus group 222*a* and a window 222*b*. The focus group 222*a* is coupled with the window 222*b*. The window 222*b* may be replaced.

In some implementations, the light pipe 206 and white light illumination device 208 are coupled with a first mounting plate 240. Additionally, in implementations including additional various reflective surfaces (not labeled) and a light level sensor 233, the various reflective surfaces and the light level sensor 233 may also be coupled with the first mounting plate 240.

The projection optics which includes the frustrated prism assembly 212, beam splitter 214, and distortion compensator 218 are coupled with a second mounting plate 242. The first mounting plate 240 and the second mounting plate 242 are planar, which allows for precise alignment of the aforementioned components of the image projection apparatus 200. This arrangement results in an apparatus that is compact. For example, the image projection apparatus 200 may have a thickness of between about 80 millimeters and about 100 millimeters.

FIG. 3A is a schematic perspective view of the light pipe 206, according to one or more implementations of the present disclosure. FIG. 3B is a schematic end view of the light pipe 206 of FIG. 3A, according to one or more implementations of the present disclosure. As previously discussed, the light pipe 206 includes a body 260 having the input face 262 and the output face 264. The input face 262 accepts light into the light pipe 206 and the output face 264 releases light from the light pipe 206. The input face 262 is orthogonal to or substantially orthogonal to a longitudinal axis of the light pipe 206. The longitudinal axis is typically a linear axis extending from the input face 262 to the output face 264. The output face 264 is orthogonal to or substantially orthogonal to the longitudinal axis of the light pipe 206. The light pipe 206 is twisted in such a way that the input face 262 is twisted with respect to the output face 264 and the sides of the body 260 are no longer flat but contain the twist 280 as shown in FIGS. 3A and 3B. Not to be bound by theory, but it is believed that the twist 280 results in substantial improvement in the homogenization of the light emanating from the output face 264.

The body 260 is a solid body. Although the body 260 is depicted as an elongated rectangular body prior to twisting, it should be understood that the body 260 may be fabricated to have a rectangular shape, a hexagonal shape, or any other suitable shape prior to twisting. Prior to twisting, the body 260 depicted in FIGS. 3A and 3B has flat sides. The body 260 is generally fabricated from a material having a refractive index that provides for total internal reflection of a light input at the input face 262 of the light pipe 206. Examples of suitable materials include plastic and glass, among others that are known to those of skill in the art. In some implementations, the body 260 is fabricated from fused silica material. The cross-sectional area of the input face 262 is substantially similar to the cross-sectional area of the output face 264.

The light pipe 206 is twisted along the longitudinal axis extending from the input face 262 to the output face 264 to form the twist 280. In some implementations, the twist 280 is substantially uniform along the longitudinal axis. In some implementations, the average twist in the body 260 is between about 0.1 degrees and about 25 degrees (e.g., between about 5 degrees and about 15 degrees; between about 10 degrees and about 15 degrees; between about 10 degrees and about 15 degrees; between about 10 degrees and about 14 degrees; or between about 5 degrees and about 10 degrees.)

As illustrated in the implementation depicted in FIGS. 3A and 3B, the input face 262 and the output face 264 each have a rectangular cross-section. The light pipe 206 includes the twist 280 along the longitudinal axis with FIG. 3B showing a view looking down the length of the longitudinal axis from the input face 262. In one implementation, the input face 262 and the output face 264 have dimensions of about 1 to 2 millimeters (e.g., 1.2 millimeters (mm)) by about 1 to 2 millimeters (e.g., 1.8 millimeters) with the body having a length of about 100 to 200 millimeters (e.g., 180 millimeters).

The input face 262 of the light pipe 206 may be illuminated with at least one fiber optic (e.g., light source 230). The fiber optic may comprise a glass core clad in a material having a lower index of refraction. The light source 230 may be coupled with the input face 262.

In some implementations, a method of shaping a beam of illumination is provided. The method may be performed using the light pipe 206. The method comprises directing light into the light pipe 206 at the input face 262 of the light pipe 206, wherein the light pipe 206 has a body 260 that is an elongated rectangular body and the input face 262 is disposed substantially orthogonal to a longitudinal axis of the body 260. The method further comprises propagating the directed light by total internal reflection through the light pipe 206 to an output face 264 of the light pipe 206, the output face 264 is disposed substantially orthogonal to the longitudinal axis. The method further comprises allowing the propagated light to emanate from the output face 264, wherein the body 260 has a twist 280 along the longitudinal axis. In some implementations, the twist is between about 5 degrees and about 15 degrees. In some implementations, the twist 280 is between about 10 degrees and about 15 degrees. In some implementations, the twist 280 is uniform between the input face 262 and the output face 264. In some implementations, the body 260 is fabricated from glass. In some implementations, the body 260 is fabricated from fused silica material. In some implementations, the input face 262 and the output face 264 are each approximately 1.2 millimeters×1.8 millimeters and the body 260 has a length along the longitudinal axis of approximately 180 millimeters or greater.

In some implementations, a method of processing a substrate is provided. The method comprises directing light into a light pipe 206 at an input face 262 of the light pipe 206, wherein the light pipe 206 has a body 260 that is an elongated rectangular body and the input face 262 is disposed substantially orthogonal to a longitudinal axis of the body 260. The body 260 has a twist 280 along the longitudinal axis. The method further comprises propagating the directed light by total internal reflection through the light pipe 206 to an output face 264 of the light pipe 206, wherein the output face 264 is disposed substantially orthogonal to the longitudinal axis. The method further comprises allowing the propagated light to emanate from the output face 264 as an elongated beam. The method further comprises illuminating a pattern to be imaged across a surface of a substrate 140, wherein the surface of the substrate 140 has a light-sensitive photoresist disposed thereon. In some implementations, the method further comprises imaging the illuminated pattern onto the light-sensitive photoresist to cause chemical changes to the light-sensitive photoresist.

Benefits of the present disclosure include an improved light pipe, or kaleido, that homogenizes light such that the light passing therethrough has improved uniformity once its exits the light pipe. By reflecting the light inside the twisted light pipe, the illumination uniformity over the field is improved.

When introducing elements of the present disclosure or exemplary aspects or implementation(s) thereof, the articles "a," "an," "the" and "said" are intended to mean that there are one or more of the elements.

The terms "comprising," "including" and "having" are intended to be inclusive and mean that there may be additional elements other than the listed elements.

While the foregoing is directed to embodiments of the present disclosure, other and further implementations of the disclosure may be devised without departing from the basic scope thereof, and the scope thereof is determined by the claims that follow.

It will be appreciated to those skilled in the art that the preceding examples are exemplary and not limiting. It is intended that all permutations, enhancements, equivalents, and improvements thereto that are apparent to those skilled in the art upon a reading of the specification and a study of the drawings are included within the true spirit and scope of the present disclosure. It is therefore intended that the following appended claims include all such modifications, permutations, and equivalents as fall within the true spirit and scope of these teachings.

What is claimed is:

1. An image projection apparatus for imaging patterns on a substrate, comprising:
    an illumination system, comprising:
        a light pipe having an elongated rectangular body that has:
            an input face for accepting light into the elongated rectangular body, the input face disposed substantially orthogonal to a longitudinal axis of the elongated rectangular body; and
            an output face for releasing light from the elongated rectangular body, the output face disposed substantially orthogonal to the longitudinal axis, wherein the elongated rectangular body has a twist along the longitudinal axis so that the input face and the output face are twisted relative to each other;
        a laser light illumination device disposed adjacent to the input face of the light pipe; and
        a light source coupled with the input face of the light pipe; and
    a projection system, comprising:
        at least one projection lens, wherein the input face and the output face are each about 1 to 2 millimeters by about 1 to 2 millimeters with the elongated rectangular body having a length along the longitudinal axis of about 100 to 200 millimeters.

2. The image projection apparatus of claim 1, wherein the twist is between about 5 degrees and about 15 degrees.

3. The image projection apparatus of claim 1, wherein the twist is induced by mounting the light pipe in the image projection apparatus.

4. The image projection apparatus of claim 1, wherein the light source is a bundle of two or more laser illuminated fibers.

5. The image projection apparatus of claim 4, wherein the light source is coupled with the light pipe through a combiner that packs the two or more laser illuminated fibers into the bundle.

6. The image projection apparatus of claim 1, wherein the twist is uniform between the input face and the output face.

7. The image projection apparatus of claim 1, wherein the elongated rectangular body is fabricated from glass.

8. A system, comprising:
    two or more stages, wherein the two or more stages are configured to hold one or more substrates; and
    a plurality of image projection apparatuses for patterning the one or more substrates, wherein each image projection apparatus comprises:
        an illumination system, comprising:
            a light pipe having an elongated rectangular body that has:
                an input face for accepting light into the elongated rectangular body, the input face disposed substantially orthogonal to a longitudinal axis of the elongated rectangular body; and
                an output face for releasing light from the elongated rectangular body, the output face disposed substantially orthogonal to the longitudinal axis, wherein the elongated rectangular body has a twist along the longitudinal axis so that the input face and the output face are twisted relative to each other; and
            a laser light source coupled with the input face of the light pipe, wherein the input face and the output face are each about 1 to 2 millimeters by about 1 to 2 millimeters with the elongated rectangular body having a length along the longitudinal axis of about 100 to 200 millimeters.

9. The system of claim 8, wherein the twist is between about 5 degrees and about 15 degrees.

10. The system of claim 9, wherein the twist is induced by mounting the light pipe in the image projection apparatus.

11. The system of claim 8, wherein the laser light source is a bundle of two or more laser illuminated fibers.

12. The system of claim 11, wherein the laser light source is coupled with the light pipe through a combiner that packs the two or more laser illuminated fibers into the bundle.

13. The system of claim 8, wherein the twist in the light pipe is uniform between the input face and the output face.

14. A method of shaping a beam of illumination, comprising:
   directing light into a light pipe at an input face of the light pipe, wherein the light pipe has an elongated rectangular body and the input face is disposed substantially orthogonal to a longitudinal axis of the elongated rectangular body;
   propagating the directed light by total internal reflection through the light pipe to an output face of the light pipe, the output face disposed substantially orthogonal to the longitudinal axis; and
   allowing the propagated light to emanate from the output face, wherein the elongated rectangular body has a twist along the longitudinal axis, wherein the input face and the output face are each about 1 to 2 millimeters by about 1 to 2 millimeters with the elongated rectangular body having a length along the longitudinal axis of about 100 to 200 millimeters.

15. The method of claim 14, wherein the twist is between about 5 degrees and about 15 degrees.

16. The method of claim 14, wherein the twist is between about 10 degrees and about 15 degrees.

17. The method of claim 14, wherein the twist is uniform between the input face and the output face.

18. The method of claim 14, wherein the elongated rectangular body is fabricated from glass.

19. The method of claim 14, wherein the elongated rectangular body is fabricated from fused silica material.

20. The method of claim 14, further comprising inducing a twist in the light pipe by mounting the light pipe in an image projection apparatus prior to directing light into the light pipe.

* * * * *